(12) United States Patent
Yu

(10) Patent No.: US 6,391,753 B1
(45) Date of Patent: May 21, 2002

(54) PROCESS FOR FORMING GATE CONDUCTORS

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/597,624

(22) Filed: Jun. 20, 2000

(51) Int. Cl.[7] .......................................... H01L 21/4763
(52) U.S. Cl. ........................ 438/587; 438/585; 438/595
(58) Field of Search ............................... 438/584, 585, 438/587, 595

(56) References Cited

U.S. PATENT DOCUMENTS

| 5,889,302 | A | | 3/1999 | Liu | |
|---|---|---|---|---|---|
| 5,918,132 | A | * | 6/1999 | Qian et al. | .................. 438/299 |
| 5,923,981 | A | * | 7/1999 | Qian | .......................... 438/284 |
| 5,936,280 | A | | 8/1999 | Liu | |
| 6,022,815 | A | * | 2/2000 | Doyle et al. | ................. 438/947 |
| 6,031,264 | A | | 2/2000 | Chien et al. | |
| 6,103,605 | A | * | 8/2000 | Hopper | ....................... 438/585 |

OTHER PUBLICATIONS

Yu, Bin, et al. "Ultra–Thin–Body Silicon–On–Insulator MOSFET's for Terabit–Scale Integration" Department of Electrical Engineering & Computer Sciences, University of California, Berkeley.

Huang, Xuejue, et al. "Sub 50–nm Fin FET: PMOS" Department of Electrical Engineering & Computer Sciences, University of California, Berkeley, 1999 IEEE.

* cited by examiner

*Primary Examiner*—Long Pham
(74) *Attorney, Agent, or Firm*—Foley & Lardner

(57) ABSTRACT

An ultra-large-scale integrated (ULSI) circuit includes MOSFETs. The MOSFETs can include a gate structure manufactured by utilizing a spacer structure as a mask. The spacer structure can be silicon dioxide formed in an etch back process.

20 Claims, 2 Drawing Sheets

PROCESS FOR FORMING GATE CONDUCTORS

CROSS REFERENCE TO RELATED APPLICATIONS

The present application is related to U.S. Ser. No. 09/597,598, entitled, "A Process for Forming Multiple Active Lines and Gate-All-Around MOSFETs", filed by Yu on an even date herewith. The present application is related to U.S. Ser. No. 09/596,993, entitled, "A Hard Mask for Integrated Circuit Fabrication", filed by Yu on an even date herewith. Both applications are assigned to the assignee in the present application.

FIELD OF INVENTION

The present invention relates to integrated circuits and methods of manufacturing integrated circuits. More particularly, the present invention relates to a method of manufacturing integrated circuits having transistors with small and/or densely packed gate conductors.

BACKGROUND OF THE INVENTION

Currently, deep-submicron complementary metal oxide semiconductor (CMOS) is the primary technology for ultra-large scale integrated (ULSI) circuits. Over the last two decades, reduction in the size of CMOS transistors has been a principal focus of the microelectronics industry.

Transistors, such as, metal oxide semiconductor field effect transistors (MOSFETs), are generally either bulk semiconductor-type devices or silicon-on-insulator (SOI)-type devices. Most integrated circuits are fabricated in a CMOS process on a bulk semiconductor substrate.

In bulk semiconductor-type devices, transistors, such as, MOSFETs, are built on the top surface of a bulk substrate. The substrate is doped to form source and drain regions, and a conductive layer is provided between the source and drain regions. The conductive layer operates as a gate for the transistor; the gate controls current in a channel between the source and the drain regions. As transistors become smaller, the body thickness of the transistor (or thickness of depletion layer below the inversion channel) must be scaled down to achieve superior short-channel performance.

Conventional SOI-type devices include an insulative substrate attached to a thin-film semiconductor substrate that contains transistors similar to the MOSFETs described with respect to bulk semiconductor-type devices. The insulative substrate generally includes a buried insulative layer above a lower semiconductor base layer. The transistors on the insulative substrate have superior performance characteristics due to the thin-film nature of the semiconductor substrate and the insulative properties of the buried insulative layer. In a fully depleted (FD) MOSFET, the body thickness is so small that the depletion region has a limited vertical extension, thereby eliminating link effect and lowering hot carrier degradation. The superior performance of SOI devices is manifested in superior short-channel performance (i.e., resistance to process variation in small size transistor), near-ideal subthreshold voltage swing (i.e., good for low off-state current leakage), and high saturation current.

Ultra-large-scale integrated (ULSI) circuits generally include a multitude of transistors, such as, more than one million transistors and even several million transistors that cooperate to perform various functions for an electronic component. The transistors are generally complementary metal oxide semiconductor field effect transistors (CMOSFETs) which include a gate conductor disposed between a source region and a drain region. The gate conductor is provided over a thin gate oxide material. Generally, the gate conductor can be a metal, a polysilicon, or polysilicon/germanium ($Si_xGe_{(1-x)}$) material that controls charge carriers in a channel region between the drain and the source to turn the transistor on and off. The transistors can be N-channel MOSFETs or P-channel MOSFETs.

Generally, it is desirous to manufacture smaller transistors to increase the component density on an integrated circuit. It is also desirous to reduce the size of integrated circuit structures, such as vias, conductive lines, capacitors, resistors, isolation structures, contacts, interconnects, etc. For example, manufacturing a transistor having a reduced gate length (a reduced width of the gate conductor) can have significant benefits. Gate conductors with reduced widths can be formed more closely together, thereby increasing the transistor density on the IC. Further, gate conductors with reduced widths allow smaller transistors to be designed, thereby increasing speed and reducing power requirements for the transistors.

Heretofore, lithographic tools are utilized to form transistors and other structures on the integrated circuit. For example, lithographic tools can be utilized to define gate conductors, conductive lines, vias, doped regions, and other structures associated with an integrated circuit. Most conventional lithographic fabrication processes have only been able to define structures or regions having a dimension of 100 nm or greater.

In one type of conventional lithographic fabrication process, a photoresist mask is coated over a substrate or a layer above the substrate. The photoresist mask is lithographically patterned by providing electromagnetic radiation, such as, ultraviolet light, through an overlay mask. The portions of the photoresist mask exposed to the electromagnetic radiation react (e.g. are cured). The uncured portions of the photoresist mask are removed, thereby transposing and the pattern associated with the overlay to the photoresist mask. The patterned photoresist mask is utilized to etch other mask layers or structures. The etched mask layer and structures, in turn, can be used to define doping regions, other structures, vias, lines, etc.

As the dimensions of structures or features on the integrated circuit reach levels below 100 nm or 50 nm, lithographic techniques are unable to precisely and accurately define the feature. For example, as described above, reduction of the width of the gate conductor (the gate length) associated with a transistor has significant beneficial effects. Future designs of transistors may require that the gate conductor have a width of less than 50 nanometers.

Thus, there is a need for an integrated circuit or electronic device that includes smaller, more densely disposed gate conductors. Further still, there is a need for a ULSI circuit which does not utilize conventional lithographic techniques to define gate conductors. Even further still, there is a need for a non-lithographic approach for defining gates having at least one topographic dimension less than 100 nanometers and less than 50 nanometers (e.g., 20–50 nm). Yet further still, there is a need for an SOI integrated circuit with transistors having gate lengths of about 20 to 50 nm.

SUMMARY OF THE INVENTION

An exemplary embodiment relates to a method of manufacturing an integrated circuit including transistors. The transistors include a first transistor having a gate structure disposed on a film. The method includes removing portions of a mask layer above a conductive layer above the film to form a mask feature, providing and removing portions of an oxide material above the mask feature in the conductive layer to leave a spacer on at least one sidewall of the mask feature. The method also includes removing the mask layer, and etching the conductive layer in accordance with the spacer, thereby forming the gate structure.

Another exemplary embodiment relates to a process of forming a gate conductor. The gate conductor has a dimension less than one lithographic feature. The process includes providing a conductive layer above a top surface of a substrate, providing a mask layer above the conductive layer, patterning the mask layer to have a sidewall, providing an insulative spacer on the sidewall of the mask layer, removing the mask layer, and etching the conductive layer in accordance with the insulative spacer. Etching the conductive layer in accordance with the insulative spacer forms the gate conductor.

Yet another embodiment relates to a method of manufacturing structures on a ultra-large scale integrated circuit. The gate structures have at least one dimension less than 50 nm. The method includes steps of depositing a mask layer over a top surface of a conductive layer above a substrate, lithographically patterning the mask layer to have a plurality of islands, providing spacers on sidewalls of the islands, removing the islands, and removing portions of the conductive layer. The islands have a dimension at least 50 nm wide. The portions of the conductive layer are removed in accordance with the spacers to form the gate structures.

BRIEF DESCRIPTION OF THE DRAWINGS

Exemplary embodiments will hereafter be described with reference to the accompanying drawings, wherein like numerals denote like elements, and.

DETAILED DESCRIPTION OF THE PREFERRED EMBODIMENTS

Figure 1:
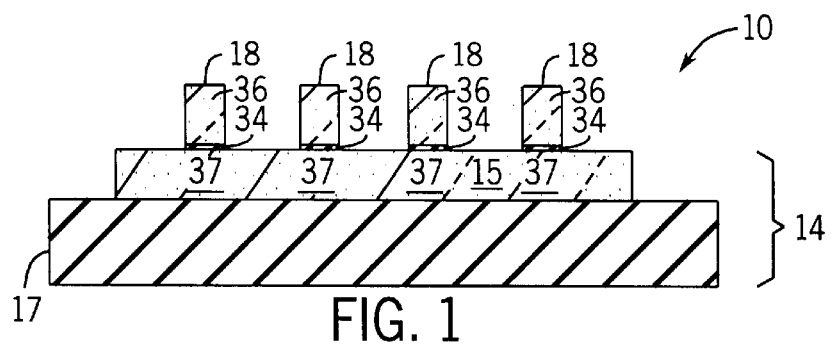
FIG. 1 is a cross-sectional view of a portion of an integrated circuit in accordance with an exemplary embodiment of the present invention, the integrated circuit including a number of gate structures provided on a semiconductor-on-insulator substrate.

With reference to FIG. 1, a portion 10 of an integrated circuit (IC) includes a number of gate structures 18. Gate structures 18 can be part of transistors formed on a semiconductor substrate 14, such as, a wafer. Semiconductor substrate 14 is preferably a semiconductor-on-insulator (SOI) substrate. Preferably, substrate 14 includes a thin film semiconductor layer 15 and an insulative layer 17. A semiconductive base layer can also be included.

Layer 17 is preferably a buried oxide layer, such as, silicon dioxide. Layer 17 can have a thickness of 1000–5000 Å. Layer 15 is preferably a layer of silicon having a thickness of 150–200 Å.

As shown in FIG. 1, transistors associated with structures 18 can be fully formed or partially formed. The transistors are part of portion 10 of the integrated circuit (IC) manufactured on a wafer (such as, a silicon bulk-type wafer or SOI wafer). The transistors can include gate structure 18, source regions, and drain regions and can be coupled to contacts, interconnects, etc.

Gate structures 18 include gate oxide structures 34 and gate conductors 36. Gate oxide structures 34 are preferably thermally grown silicon dioxide to thickness of 12–20 Å on layer 15 of substrate 14. Alternatively, other materials, such as, silicon nitride ($Si_3N_4$) high K gate dielectrics, or other insulators can be deposited by chemical vapor deposition (CVD) for structures 34. Gate stack or structures 18 can include spacers. The spacers can be silicon nitride, silicon dioxide ($S_iO_2$) or other insulative material.

Conductors 36 are preferably deposited as undoped or doped polysilicon by chemical vapor deposition (CVD) and etched to form the particular structure for the transistors. Gate conductors 36 can traverse substrate 14 in accordance with various circuit designs. Alternatively, conductors 36 can include metal, such as, titanium nitride (TiN), Molybdenum (Mo), Tungsten (W), or other conductor. Gate conductors 36 and structures 18 preferably have a height or thickness of 1000–1500 Å.

Gate structures 18 can be disposed over ultra-thin body channel regions 37. Channel regions 37 can have a thickness less than 200 Å which reduces the susceptibility of the transistor to short channel affects such as voltage roll-off and drain induced barrier lowering. Channel region 37 is located between source and drain regions underneath gate oxide layers 34. Region 37 is as thick as layer 15 associated with substrate 14. In an alternative embodiment, gate structures 18 can be provided over conventional channel regions in a bulk-type substrate.

Gate structures 18 including conductors 36 and structures 34 advantageously have a width (e.g., from left to right associated with a gate length of a transistor) of 20–50 nm. An advantageous process forms structures 18 without the direct use of photolithography. Preferably, gate structures 18 are spaced from 100–600 nm from each other. The reduced width associated with gate structures 18 allows multiple, densely packed transistors to be formed on substrate 14.

Gate structures 18 can be for transistors which are N-channel or P-channel field effect transistors, such as, a metal oxide semiconductor field effect transistors (MOSFETs). The transistors can be at least partially covered by an insulative layer and is preferably part of an ultra-large scale integrated (ULSI) circuit that includes one million or more transistors.

With reference to FIGS. 1–8, the fabrication of gate structures 18 is described below as follows. As discussed above with reference to FIG. 1, gate structures 18 can be formed which have at least one dimension (topographic) less than conventional lithographic capabilities (less than 100 nm). The dimension of less than one lithographic feature can be affected by the type of lithographic equipment, the wavelength of the light from the equipment, and other lithographic factors.

Figure 2:
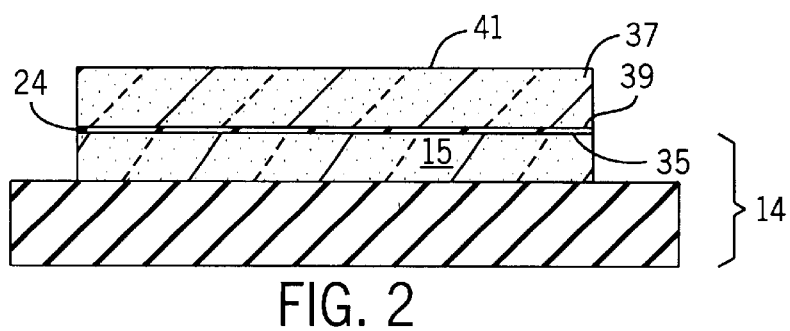
FIG. 2 is a cross-sectional view of the portion of the integrated circuit illustrated in FIG. 1, showing a conductive layer formation step and a gate oxide formation step.

In FIG. 2, a gate oxide layer 24 is deposited or thermally grown over a top surface 35 of layer 15. Layer 24 is associated with oxide structures 34 (FIG. 1) and is preferably thermally grown as silicon dioxide. A layer 37 which is associated with conductors 36 (FIG. 1) is deposited on top surface 39 of layer 24. Preferably, layer 37 is a conductive layer, such as, a polysilicon film. Layer 37 can have a thickness of 1000–1500 Å and can be deposited by CVD.

Figure 3:
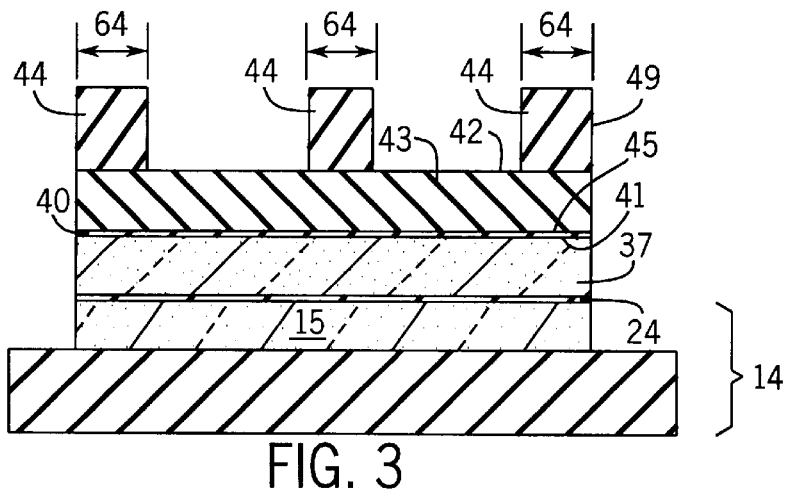
FIG. 3 is a cross-sectional view of the portion of the integrated circuit illustrated in FIG. 2, showing a mask deposition step and a lithographic step.

In FIG. 3, after layer 37 is deposited, a layer 40 is deposited on a top surface 41 of layer 37. Layer 40 is preferably deposited by CVD as a 100–200 Å thick buffer oxide layer. Layer 40 can be silicon dioxide deposited in a tetraethylorthosilicate (TEOS) process.

After layer 40 is provided, a layer 43 is provided as a cap layer, such as, a silicon nitride cap layer. Layer 43 is deposited by CVD over a top surface 45 of layer 40 and has a thickness of 800–1500 Å. Layer 43 serves as an anti-reflective coating for superior lithographic capabilities as well as a sacrificial (dummy) mask layer. Alternatively, other nitride layers or mask materials can be utilized as layer 43.

Figure 4:
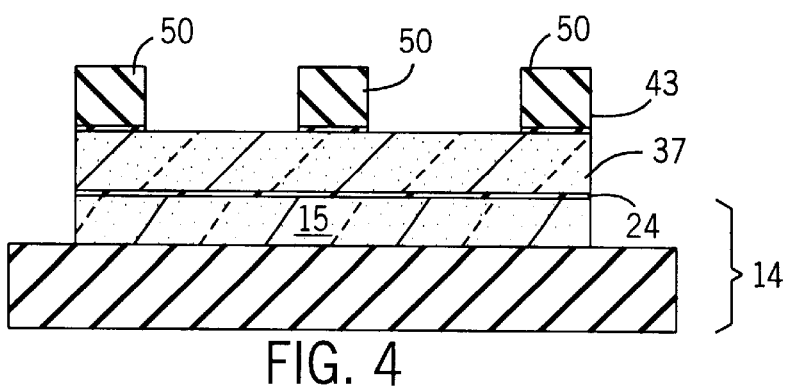
FIG. 4 is a cross-sectional view of the portion of the integrated circuit illustrated in FIG. 3, showing a mask etching step.

In FIG. 3, a photoresist layer 49 is applied above a top surface 42 of layer 37. Photoresist layer 49 is lithographically configured in accordance with a conventional tool to form a pattern including photoresist structures 44. Various photolithographic processes and materials can be utilized to leave structures 44 on top surface 42 of layer 43. Dimensions 64 associated with structures 44 are larger than the widths of conductors 36 (FIG. 1). In FIG. 4, after structures 44 are formed, layers 43 and 40 are etched in accordance with photoresist structures 44 to leave mask features or islands 50 associated with layer 43. Islands 50 have a width corresponding to dimension 46 (100–500 nm)(FIG. 3) and are spaced from each other by 100 to 600 nm.

Figure 5:
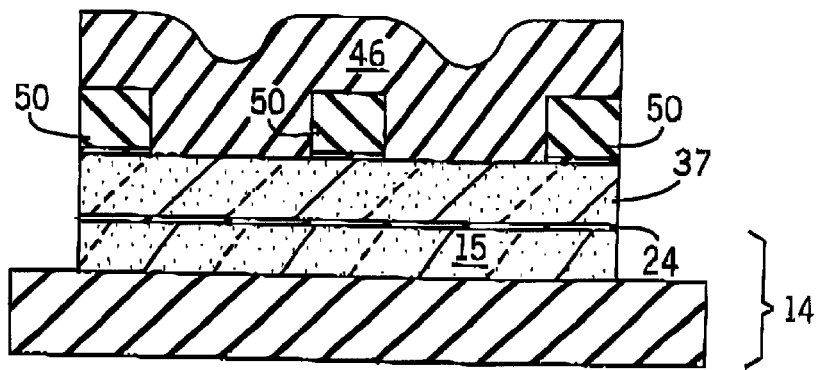
FIG. 5 is a cross-sectional view of the portion of the integrated circuit illustrated in FIG. 4, showing an insulative layer deposition step.

In FIG. 5, islands 50 and layer 37 are covered by a non-conformal insulative layer 46. Preferably, insulative layer 46 is a TEOS blanket deposited silicon dioxide layer. Insulative layer 46 is preferably thicker than islands 50 (e.g., 3000–5000 Å thick).

Figure 6:
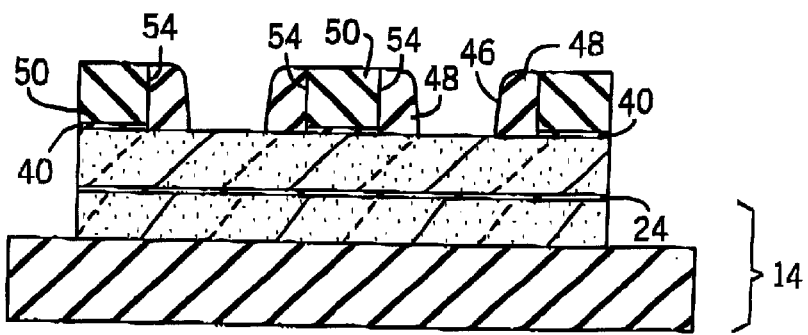
FIG. 6 is a cross-sectional view of the portion of the integrated circuit illustrated in FIG. 5, showing a spacer formation step.

In FIG. 6, portions of insulating layer 46 are etched to leave spacers 48 on sidewalls 54 of islands 50. Spacers 48 abut sidewalls 54 of islands 50. Preferably, layer 46 utilizes a conventional anisotropic dry etch back process to leave spacers 48. The width of spacers 48 is preferably controlled to be less than 100 nm, preferably between 20–50 nm. The width of spacers 48 is preferably less than the width of islands (e.g., 50 nm).

Figure 7:
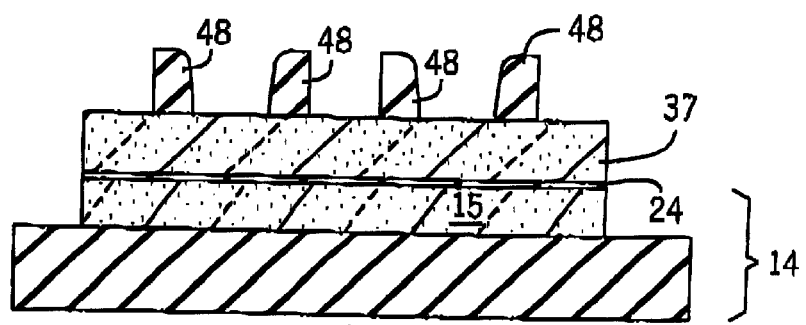
FIG. 7 is a cross-sectional view of the portion of the integrated circuit illustrated in FIG. 6, showing a mask removal step.

In FIG. 7, after spacers 48 are formed, islands 50 are removed in a wet chemical etching process. In addition, portions of layer 40 underneath islands 50 are removed. Alternatively, other removal processes can be utilized to remove islands 50 and layer 40. Thus, layer 43 (islands 50) can serve as a sacrificial (dummy) film for forming oxide hard masks (e.g., spacers 48).

Figure 8:
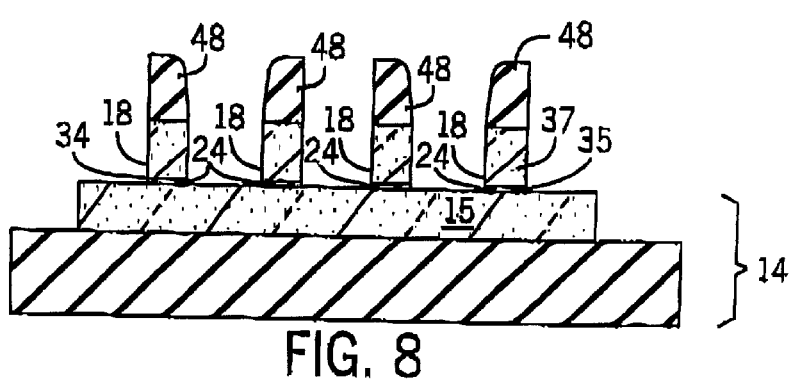
FIG. 8 is a cross-sectional view of the portion of the integrated circuit illustrated in FIG. 7, showing a conductive layer etching step.

In FIG. 8, layers 37 and 35 are etched in accordance with spacers 48 to leave gate structures 18. Thus, spacers 48 act as an oxide hard mask for forming structures 18. The width (from left to right) of structures 18 and oxide structures 34 is preferably similar to the width of spacers 48 (e.g., less than 100 nm, preferably 20–50 nm or the spacing between islands 50). Spacers 48 can have 0.04 to 0.5 the width of islands 50. Generally, gate structures 18 are between 100–500 nm apart (e.g., the width of islands 50). Thus, densely packed gate structures 18 are formed on substrate 14 according to an oxide hard mask process which does not directly rely on conventional photolithographic etching process.

Layers 37 and 24 can be etched in a dry etching or a wet etching process. Preferably, a dry etching process selective to polysilicon is utilized to etch layer 37. A dry etching process selective to silicon dioxide can etch layer 24 to leave structures 34. This step can at least partially etch spacers 18. Layers 37 and 24 form a polysilicon silicon dioxide stack for structures 18.

In FIG. 1, spacers 48 are removed by a dry etching process selective to silicon dioxide. In one embodiment, silicon nitride spacers for structure 18 are formed before spacers 48 are removed to protect structures 34 from the silicon dioxide etch. Conventional SOI MOS fabrication processing can be utilized to formed transistors, contacts, interconnects and interlevel dielectrics for portion.

It is understood that while the detailed drawings, specific examples, and particular values given provide a preferred exemplary embodiment of the present invention, the preferred exemplary embodiment is for the purpose of illustration only. The method and apparatus of the invention is not limited to the precise details and conditions disclosed. For example, although SOI substrates are shown, other substrates can be utilized. Various changes may be made to the details disclosed without departing from the spirit of the invention which is defined by the following claims.

What is claimed is:

1. A method of manufacturing an integrated circuit including a plurality of transistors, the plurality of transistors including a first transistor having a gate structure disposed on a film, the method comprising:

removing portions of a mask layer above a conductive layer above the film to form a mask feature, the mask feature having at least one sidewall;

providing an oxide material above the mask, the oxide material being a thick, non-conformal layer;

removing portions of the oxide material above the mask feature and the conductive layer to leave a spacer on the at least one sidewall;

removing the mask feature; and etching the conductive layer in accordance with the spacer, thereby forming the gate structure.

2. The method of claim 1, wherein the gate structure has a width between 20 nm and 50 nm.

3. The method of claim 2, wherein an oxide layer is disposed between the mask layer and the conductive layer.

4. The method of claim 1, wherein the mask layer is a nitride layer and the conductive layer is a polysilicon layer.

5. The method of claim 1, wherein the film is part of a silicon-on-insulator substrate.

6. The method of claim 5, wherein the spacer is 0.04 to 0.5 times as wide as the mask feature.

7. A process of forming a gate conductor having a dimension less than one lithographic feature, the process comprising:

providing a conductive layer above a top surface of a substrate;

providing a mask layer above the conductive layer, the mask layer having a first thickness;

patterning the mask layer to have a sidewall;

providing a non-conformal insulative material above the mask layer, the insulative material having a second thickness greater than the first thickness;

forming an insulative spacer from the insulative material on the sidewall of the mask layer;

removing the mask layer; and etching the conductive layer in accordance with the insulative spacer as a mask to form the gate conductor.

8. The process of claim 7, wherein the gate conductor includes polysilicon.

9. The process of claim 8, wherein the mask layer includes nitride.

10. The process of claim 7, wherein a plurality of gate structures are formed and the providing step includes forming a plurality of insulative spacers on respective sidewalls of the mask layer.

11. The process of claim 7, wherein a gate oxide layer is below the conductive layer.

12. The process of claim 7 wherein the insulative spacer is 20–50 nm wide.

13. The process of claim 12, wherein the insulative spacer is TEOS deposited silicon dioxide.

14. A method of manufacturing a plurality of gate structures on an ultra-large scale integrated circuit, the gate structures having at least one dimension less than 50 nm, the method comprising steps of:

depositing a mask layer over a top surface of a conductive layer above a substrate;

lithographically patterning the mask layer to have a plurality of islands, the islands having a minimum topographic dimension at least 50 nm wide;

providing a non-conformal spacer layer above the islands, the spacer layer at least completely filling the gaps between the islands;

forming spacers on sidewalls of the islands from the spacer layer;

removing the islands; and removing portions of the conductive layer in accordance with the spacers, the spacers being a hard mask for the removing portions step.

15. The method of claim 14, wherein the islands are spaced from each other at least 100 nm.

16. The method of claim 15, wherein the islands are between 100–500 nm wide.

17. The method of claim 16, wherein the spacers are 20–50 nm wide.

18. The method of claim 14, forming the spacers step is a deposition and etch back step.

19. The method of claim 18, wherein the spacers include TEOS deposited silicon dioxide.

20. The method of claim 14, wherein the mask layer includes nitride.

* * * * *